United States Patent
Ertl et al.

(10) Patent No.: US 7,718,274 B2
(45) Date of Patent: May 18, 2010

(54) METHOD FOR WELDING TWO WELDING PARTS BY MEANS OF A FILLET WELD AND WELDING PART WITH AN INCLINED TAPERED EDGE AREA THEREFOR

(75) Inventors: Thomas Ertl, Gottmadingen (DE);
Hardy Wilkendorf, Owingen (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 139 days.

(21) Appl. No.: 11/666,764

(22) PCT Filed: Nov. 15, 2005

(86) PCT No.: PCT/DE2005/002054

§ 371 (c)(1),
(2), (4) Date: Feb. 13, 2008

(87) PCT Pub. No.: WO2006/050722

PCT Pub. Date: May 18, 2006

(65) Prior Publication Data
US 2008/0245844 A1     Oct. 9, 2008

(30) Foreign Application Priority Data
Nov. 15, 2004     (DE) ..................... 10 2004 055 083

(51) Int. Cl.
*B23K 35/12*    (2006.01)
*H01L 23/36*    (2006.01)
*H01L 21/00*    (2006.01)

(52) U.S. Cl. .................. 428/576; 257/712; 438/122; 228/57

(58) Field of Classification Search .............. 428/576; 257/712; 438/122; 228/5.1, 56.3, 57
See application file for complete search history.

(56) References Cited

U.S. PATENT DOCUMENTS

| | | | |
|---|---|---|---|
| 2,177,927 A | * | 10/1939 | Hodge ..................... 403/270 |
| 2,895,747 A | * | 7/1959 | Bland et al. ............... 285/21.1 |
| 5,977,511 A | | 11/1999 | Meier et al. |
| 6,310,315 B1 | * | 10/2001 | Tayebati ................. 219/121.64 |
| 6,829,945 B2 | * | 12/2004 | Gilch et al. ................... 73/777 |

FOREIGN PATENT DOCUMENTS

| | | |
|---|---|---|
| DE | 19625873 | 1/1998 |
| DE | 197 53 103 A1 | 6/1999 |
| DE | 199 12 443 A1 | 10/2000 |
| JP | 2-11279 A | 1/1990 |
| JP | 4-270084 | 9/1992 |
| JP | 2002-18583 A | 1/2002 |

\* cited by examiner

*Primary Examiner*—Evan Pert
(74) *Attorney, Agent, or Firm*—Tarolli, Sundheim, Covell & Tummino LLP

(57) ABSTRACT

The invention relates to a method for welding two welding parts (1, 3) by means of a fillet weld (11), wherein a first welding part (1), with a bearing surface at least in an edge area of an edge that is to be welded by means of a fillet weld, is brought into contact with a bearing surface of a welding part (3) and the welding energy (5) is supplied in an energy supply area during the welding process, exclusive of a surface (7) of the first welding part facing away from the bearing surface, said energy supply area being located at a predetermined distance from the edge of the first welding part. The welding energy is supplied in a direction, whereby the direction component thereof points perpendicular to the course of the fillet weld that is to be produced in the direction of an inner area of the first welding part, forming a welding angle of less than 90° with the contact plane of the bearing surfaces of the first and second welding parts. The welding energy is supplied until at least the energy supply area of the first welding part and a sufficient area of the second part, which is adjacent to the energy supply area of the first welding part, and also the material supply area located between the energy supply area and the edge of the first welding part are melted and fused together. The invention also relates to a welding part for carrying out said method and to an electric component with a printed conductor, which is welded to a cooling body of at least one power semiconductor element.

11 Claims, 2 Drawing Sheets

METHOD FOR WELDING TWO WELDING PARTS BY MEANS OF A FILLET WELD AND WELDING PART WITH AN INCLINED TAPERED EDGE AREA THEREFOR

FIELD OF THE INVENTION

The invention pertains to a method for welding two welding parts by means of a fillet weld, especially for the welding of the metallic heat sink of a sensitive power semiconductor unit to a conductor track. Furthermore, the invention pertains to the design of a special welding part which is suitable for the accomplishment of the procedure.

BACKGROUND OF THE INVENTION

From DE 199 12 443, an electrical assembly with at least one semiconductor element is known, by which, for example, a conductor track formed as a conducting-lead frame is welded to a metallic heat sink of a power semiconductor unit by means of a fillet weld. Through this, a secure electrical contact is reached and, at the same time, the lead-away of the dissipated heat of the power semiconductor unit to the conductor track is assured. Moreover, since the heat sink of a power semiconductor unit is ordinarily joined to a connector contact of the assembly, there is the advantage that the connector contact in question does not additionally still have to be connected electrically with the conductor track in question.

When welding a power semiconductor unit to a conductor track, it is necessary to bring as little heat as possible to the heat sink of the power semiconductor unit during the welding procedure, as otherwise there is the danger of damage or destruction of the semiconductor chip placed on the heat sink.

The welding procedure carried out up to now by the applicant is more closely explained briefly in the following, by means of the representations in the FIGS. 1a and 1b to illustrate the difficulties connected with it.

As represented in FIG. 1a, a first welding part 1, which can be for example a conductor track in the form of a conducting-lead frame, is brought into contact with its lower surface at the top of a second welding part 3. In the case of the second welding part, it can be for example the metallic heat sink of a power semiconductor unit.

The welding should take place, for example, by means of laser welding on the right edge of the first welding part 1. In this regard, the welding energy is introduced to the first welding part at its edge area by means of a laser beam 5. Since it concerns the heat sink of a power semiconductor unit for the second welding part 3, one must make sure that the welding energy is introduced only in as small a dosage as possible to the second welding part 3, in order to prevent damage or destruction of the semiconductor chip. As a result, the laser beam is so positioned with respect to the first welding part 1 that the laser beam, which has a diameter corresponding to the bead width $w_o$ lies with its entire bead of diameter $w_o$ in the range of the top edge of the first welding part 1. After experiments, it has been established that the angle which the laser beam has with the contact area between the first and second welding part 1, 3 should preferably lie in the area of 50 to 80 degrees. If the angle which the laser beam 5 makes with the contact surface were to be 90 degrees or more, then the desired fillet weld would not develop between the edge of the first welding part 1 and the top of the second welding part 3.

The completed weld joint is shown in FIG. 1b. The top corner area or, respectively, the edge area of the first welding part is melted by means of the supply of the welding energy of the laser beam 5. Since it was not permitted in this case to direct the laser beam directly into the corner area between the edge of the first welding part 1 and the top area of the second welding part 3, the entire top edge or, respectively, edge area of the first welding part 1 must, consequently, be melted. In the process, the welding energy must be so great and sustained for so long, until not only the entire edge area of the first welding part 1 is melted, but also, a sufficient area of the second welding part 3, which is adjacent to the melted edge of the first welding part, is melted as well and fused with the material of the first welding part 1.

The completed weld pattern of the fillet weld is shown in FIG. 1b. As a result of the required melting of the top edges and the welding energy used, which has to be as low as possible, there is frequently a welding pattern which is optically somewhat unappealing since a relatively large material flow is necessary.

Furthermore, the positioning of the welding parts relative to the laser beam, as a consequence of the perpendicular edge of the first welding part, is very critical. Even minimal displacement of the first welding part 1 in FIG. 1a to the left would cause the laser beam to register its welding energy closer and closer to the sensitive second welding part 3 or even upon it. That is absolutely to be prevented.

Furthermore, small position changes of the first welding part 1 relative to the laser beam 5 lead to strong different material flows during melting of the edge area of the first welding part 1. The production of an optically appealing, uniformly shaped welding bead is therefore difficult.

SUMMARY OF THE INVENTION

The invention is therefore based, starting from the state of the technology, on the task of developing a method to weld two welding parts by means of a fillet weld, which also makes possible the fusing of a first welding part with a thermal sensitive second welding part and which, at the same time, shows a lower sensitivity with respect to the positioning of the first welding part relative to the position of the supply point for the welding energy. Furthermore, the invention is based on the task of developing a suitable welding part for this purpose, as well as an electrical assembly with a conductor track which is connected by means of a welding fillet with a heat sink of at least one power semiconductor unit.

The invention is based on the knowledge that the welding energy to produce a fillet weld between a first and a second welding part can be so produced, that during the welding procedure the welding energy is supplied exclusively to one of the surfaces, other than the bearing surface of the first welding part, into an energy supply area which has a predetermined distance from the edge of the first welding part. Through this, there is less position sensitivity since the welding energy is no longer, as displayed in connection with FIGS. 1a and 1b, partly fed onto a vertical side face of the first welding part. Surprisingly, it has been established by experiments that a welding is still also possible when the energy supply takes place in an energy supply area, which has a predetermined distance from the edge of the first welding part. Depending on the thickness of the first welding part, there must be, in fact, so much energy delivered that the entire material is melted in the thickness of the first welding part in the area of the energy supply area. However, this thickness of the first welding part in the energy supply area can be appropriately chosen. Besides the reduced position sensitivity, there is the advantage, according to the method pursuant to the invention, that the material between the energy supply area and the actual edge of the first welding part can take over the function of a delivery material for the production of a complete and good welding bead. The supply of the welding energy takes place preferably in one direction, in which case the component perpendicular to the course of the fillet weld to be produced comprises a welding angle in the range of 50 to 80 degrees with the contact surface of the bearing surface of the first and second welding part.

In the case of the preferred construction form of the invention, the welding energy is supplied by means of a pulsed, for example, welding laser. For the creation of the predetermined welding bead length, it is of course necessary in doing so to move the welding part relative to the point or bead formed area, into which the respective energy supply takes place.

The first welding part, pursuant to the invention, is provided in its edge area, which contains the energy supply area, with a special structure that supports the welding procedure for the production of a fillet weld.

This structure can, for example, be chosen so that the edge area in planes perpendicular to the contact plane and perpendicular to the direction of the fillet weld has a tapering cross-section. For example, the surface of the edge area can have a beveled plane, which contains the energy supply area and the material delivery area. The punctiformed or, if need be, also linear formed supply of the welding energy can then take place in the prescribed way, preferably in such a manner that the direction of the energy supply is perpendicular to the beveled plane.

According to another construction form of the invention, the welding part in the edge area in the area of the energy supply or in an area adjacent to the energy supply area in the direction of the inner part of the welding part can be shaped thinner than the inner area of the first welding part. The result of this is that a relatively high heat transmission resistance between the place of the energy supply and the turned-away area of the first welding part is achieved. The welding energy incorporated thus remains concentrated in the edge area.

At the same time, the energy supply area adjacent to the thinner area and/or the material delivery area adjacent to the thinner area can be designed thicker than the related thinner area of the first welding part. This structure can, for example, be produced by means of the stipulation of a depression or recess in the edge area of the first welding part. The supply of the welding energy can then take place on the floor of the recess as well as in the area of the thicker edge. In any case, the thinner area acts as a heat transmission resistance which reduces heat energy drain.

The structure for advantageous production of the fillet weld can be created on the first welding part by means of a cold forming process, for example a stamping procedure. If the welding part is produced as a stamped part, the cold forming process can take place in the same work step as the stamping procedure, in which case the stamping tool has its shearing edge following a corresponding stamping area. The first welding part can also have a material feed area, in which the material is different from the material of the rest of the first welding part. This material can, for example, have a lower softening or melting temperature or contain substances which have an advantageous effect on the forming of the welding bead, and in regard to its geometrical structure as well as the material composition and other parameters such as stability and suchlike.

Further embodiments of the invention arise from subordinated claims.

BRIEF DESCRIPTION OF THE DRAWINGS

The invention is explained in more detail as follows on the basis of the construction examples depicted in the figure. The drawings show.

DESCRIPTION OF EXAMPLE EMBODIMENTS

Figure 1A:
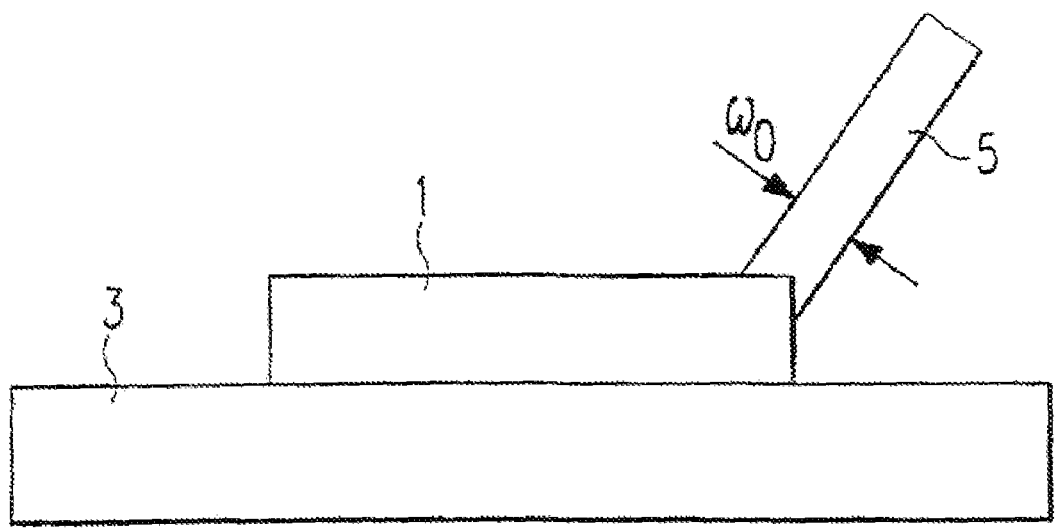
FIGS. 1a and 1b are schematic illustrations of a side view of a first and a second welding part for the carrying out of a known laser welding procedure.
Figure 1B:
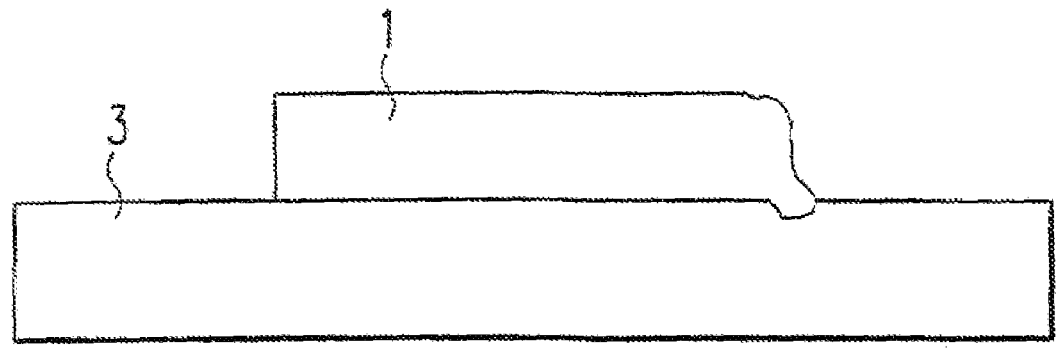
Figure 2A:
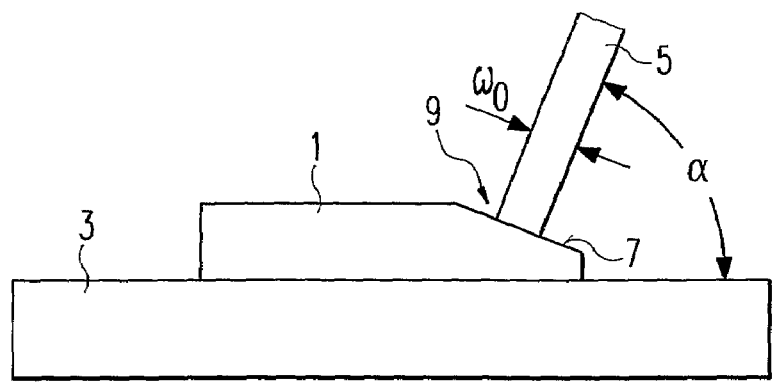
FIGS. 2a and 2b are schematic illustrations of a first and a second welding part for the elucidation of the welding procedure according to the invention and FIG. 3 an illustration similar to FIG. 2a with another embodiment of a first welding part.

The side view in FIG. 2a shows schematically a first welding part 1, which seats, with its lower surface, on the top side of a second welding part 3. In the case of the first welding part 1, for example, it can be a matter of a conductor track in the form of a conducting-lead frame, which should be welded to a second welding part 3 designed as a power semiconductor unit. In this case, the side view would show the heat sink of the power semiconductor unit.

The welding can, for example, take place through energy supply by means of a laser beam 5, which has a bead diameter $w_o$. The energy supply thus takes place, as shown in FIG. 2a, in a basically circular formed bead with diameter $w_o$. For improvement of the welding procedure compared to the known method, the first welding part 1 has a bevel in its edge area (shown at the right in FIG. 2a), which tapers in the direction of the edge of the welding part 1. This bevel 7 represents a favorable structure 9 of the welding method for production of a fillet weld between the first welding part 1 and the second welding part 3.

Figure 2B:
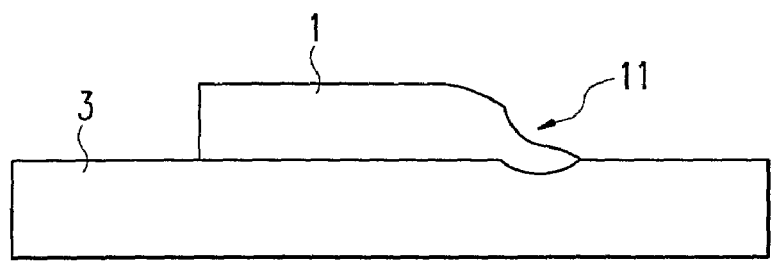

As depicted in FIG. 2a, the direction of the energy supply using the laser beam 5 can be perpendicular to the bevel 7. For the production of a fillet weld of a defined length, a relative movement must be carried out, of course, between the laser beam 5 and the first and second welding part 1, 3. The energy supply is, of course, to be chosen so that the entire area of the first welding part underneath the energy supply area (corresponding in the portrayed design example to the bead of the laser beam 5 on the bevel 7) and, furthermore, an adjacent partial area of the material in the surface of the second welding part 3 melts, whereby the melted material area of the two welding parts 1, 3 melt together and produce the fillet weld 11. FIG. 2b shows, likewise in a side view, the welding parts 1, 3 welded by means of a fillet weld 11.

As a result of the supply of the welding energy onto the surface of the first welding part 1 in the energy supply area, which has a predetermined distance from the edge of the first welding part 1, there is a small positioning sensitivity of the welding parts 1, 3 in relation to the position of the energy supply. Furthermore, the area between the energy supply area and the edge of the first welding part serves as a material feed area. In the process, the energy supply and the structure 9 are to be adjusted to each other so that, preferably, the entire material feed area melts during the welding procedure and the fillet weld 11 develops at the same time. In this way a possibly needed feed of additional material is unnecessary.

Figure 3:
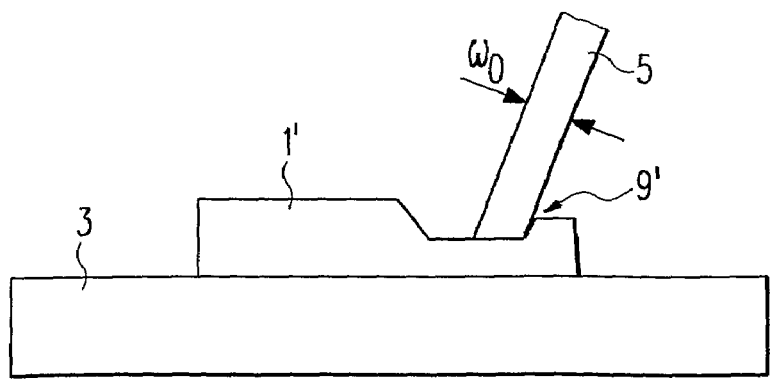

FIG. 3 shows an alternate structure 9' in the edge area of the first welding part 1'. The edge area 9' comprises, in the case of the welding part 1' according to FIG. 3, a recess with sidewalls slanting downward. The energy supply by means of a laser beam 5 can, for example, take place such that the spot of the laser with a bead width $w_o$ is located in the area of the outer side wall. In this way, it is achieved that, in the area of the laser spot, only relatively little material must be melted in the depth of the first welding part 1'. The thin floor of the recess in the edge area of the first welding part 1', left of the laser spot, that is in the direction of the inner area of the welding part 1', functions as a relatively large heat transmission resistance with respect to the heat transfer from the supply position of the energy in the direction to the thicker areas (in the inner area) of the first welding part 1'.

As shown in FIG. 3, the material feed area, which borders the energy supply area on the right, can again be shaped thicker. The thickness and, respectively, the amount of material of the material feed area can be adjusted to the special requirements for carrying out the welding procedure and, respectively, the production of the fillet weld.

At the same time, it is pointed out in FIG. 3 that the material feed area can consist of a material different than the material of the other welding part 1'. One such material feed area made of a different material can be produced, for example, by means of applying in plated form or such.

The invention claimed is:

1. A welding part for welding to a second welding part by means of a fillet weld (11), wherein:
   a first welding part (1) has a bearing surface which, at least in an edge area, can be brought into contact with a bearing surface of a second welding part (3) to be welded by means of a fillet weld (11),
   the edge area of the first welding part (1) has an energy supply area for the supply of welding energy on one of the bearing surfaces turned away from the surface of the first welding part (1),
   the edge area has a structure (9') which is favorable to the supply of energy for producing the fillet weld (11),
   the energy supply area or an area adjacent to the energy supply area in the direction of an inner area of the first welding part (1) is thinner than the inner area of the welding part (1), and
   an area adjacent to the energy supply area in a direction away from the inner area of the first welding part (1) and/or a material feed area adjoining the thinner area in a direction away from the inner area is thicker than the thinner area.

2. The welding part according to claim 1, wherein the edge area features a tapering cross-section in planes perpendicular to a contact plane between the first welding part (1) and the second welding part (3) and perpendicular to the direction of the fillet weld.

3. The welding part according to claim 1, wherein the structure (9') is produced by means of a cold forming process, for example a stamping procedure.

4. The welding part according to claim 3, wherein the welding part (1) is produced as a punched part and that the stamping procedure for production of the structure (9') takes place in one work step with the punching of the welding part (1).

5. A welding part for welding to a second welding part by means of a fillet weld (11), wherein:
   a first welding part (1) has a bearing surface which, at least in an edge area, can be brought into contact with a bearing surface of a second welding part (3) to be welded by means of a fillet weld (11),
   the edge area of the first welding part (1) has an energy supply area for the supply of welding energy on one of the bearing surfaces turned away from the surface of the first welding part (1),
   the edge area has a structure (9') which is favorable to the supply of energy for producing the fillet weld (11),
   the energy supply area or an area adjacent to the energy supply area in the direction of an inner area of the first welding part (1) is thinner than the inner area of the welding part (1),
   an area adjacent to the energy supply area in a direction away from the inner area of the first welding part (1) and/or a material feed area adjoining the thinner area in a direction away from the inner area is thicker than the thinner area,
   wherein the first welding part (1) comprises an electrical assembly with a conductor track and the second welding part (3) comprises a heat sink of a power semiconductor.

6. A welding part comprising:
   a first welding part (1) having a bearing surface that includes an edge area, the edge area including a recess (9') defining an energy supply area that receives a supply of welding energy; and
   a second welding part (3) having a bearing surface;
   the energy supply area of the first welding part (1) receiving a supply of welding energy to cause the bearing surface of the first welding part (1) to come into contact with the bearing surface of the second welding part (3) in order to weld the first welding part (1) to the second welding part (3) by forming a fillet weld (11).

7. The welding part according to claim 6, wherein the energy supply area is spaced from an outer edge of the first welding part (1) by a material feed area that is thicker than the energy supply area in a direction away from the second welding part (3).

8. The welding part according to claim 7, wherein the material feed area is thinner than an inner area of the first welding part (1) in a direction away from the second welding part (3).

9. The welding part according to claim 7, wherein the material feed area comprises a material that is different from the material of the energy supply area.

10. The welding part according to claim 7, wherein the material feed area melts during formation of the fillet weld (11).

11. The welding part according to claim 10, wherein the material feed area melts completely during formation of the fillet weld (11).

* * * * *